(12) United States Patent
Kim et al.

(10) Patent No.: US 10,032,797 B2
(45) Date of Patent: Jul. 24, 2018

(54) OXIDE SEMICONDUCTOR-BASED TRANSISTOR AND METHOD OF MANUFACTURING THE SAME

(71) Applicant: CHUNGBUK NATIONAL UNIVERSITY INDUSTRY ACADEMIC COOPERATION FOUNDATION, Chungcheongbuk-do (KR)

(72) Inventors: Sung Jin Kim, Gyeonggi-do (KR); Ju Song Eom, Gyeonggi-do (KR)

(73) Assignee: CHUNGBUK NATIONAL UNIVERSITY INDUSTRY ACADEMIC COOPERATION FOUNDATION, Chungcheongbuk-do (KR)

( * ) Notice: Subject to any disclaimer, the term of this patent is extended or adjusted under 35 U.S.C. 154(b) by 0 days.

(21) Appl. No.: 15/340,766

(22) Filed: Nov. 1, 2016

(65) Prior Publication Data
US 2017/0294455 A1 Oct. 12, 2017

(30) Foreign Application Priority Data
Apr. 12, 2016 (KR) .................. 10-2016-0045069

(51) Int. Cl.
*H01L 29/10* (2006.01)
*H01L 27/12* (2006.01)
(Continued)

(52) U.S. Cl.
CPC ...... *H01L 27/1225* (2013.01); *H01L 27/1214* (2013.01); *H01L 29/41733* (2013.01);
(Continued)

(58) Field of Classification Search
CPC ............ H01L 27/1214; H01L 27/1225; H01L 51/5048; H01L 51/5072
(Continued)

(56) References Cited

U.S. PATENT DOCUMENTS

2010/0140612 A1* 6/2010 Omura .............. H01L 29/78618
257/43
2010/0258803 A1* 10/2010 Matsumuro ........... H01L 27/283
257/59
(Continued)

FOREIGN PATENT DOCUMENTS

KR 10-2008-00826616 9/2008 .............. B81B 7/04

OTHER PUBLICATIONS

Eom, J.S., et al. (2016) "Indium-Zinc-Oxide Thin Film Transistor based PBD". *College of Electrical and Computer Engineering, Chungbuk National University, The 23rd Korean Conference on Semiconductors* (KCS2016) (Feb. 23, 2016).

*Primary Examiner* — David Vu
*Assistant Examiner* — Brandon Fox
(74) *Attorney, Agent, or Firm* — Harness, Dickey & Pierce, P.L.C.

(57) ABSTRACT

Disclosed are an oxide semiconductor-based transistor and a method of manufacturing the same. The oxide semiconductor-based transistor includes: a substrate provided with a bottom electrode; an insulator layer formed on the substrate; an active layer formed on the insulator layer; an electron transport layer formed on the active layer; and a top electrode formed on the electron transport layer. Since the oxide semiconductor-based transistor has a hybrid channel of PBD formed along with indium-zinc oxide (IZO), it is possible to improve mobility of electric charges and stability of electric devices and control a threshold value.

14 Claims, 5 Drawing Sheets

(51) Int. Cl.
*H01L 29/417* (2006.01)
*H01L 29/66* (2006.01)
*H01L 29/786* (2006.01)
*H01L 51/50* (2006.01)

(52) U.S. Cl.
CPC .... *H01L 29/66969* (2013.01); *H01L 29/7869* (2013.01); *H01L 51/5048* (2013.01); *H01L 51/5072* (2013.01)

(58) Field of Classification Search
USPC .......................................................... 257/43
See application file for complete search history.

(56) References Cited

U.S. PATENT DOCUMENTS

| | | | | |
|---|---|---|---|---|
| 2012/0207973 A1* | 8/2012 | Sakai | ................... | G02B 1/118 |
| | | | | 428/141 |
| 2013/0320304 A1* | 12/2013 | Chang | ................... | C08K 5/42 |
| | | | | 257/40 |
| 2014/0284581 A1* | 9/2014 | Zheng | ................ | H01L 51/0061 |
| | | | | 257/40 |
| 2015/0123115 A1* | 5/2015 | Kim | ................ | H01L 21/02554 |
| | | | | 257/43 |
| 2016/0197194 A1* | 7/2016 | Okazaki | ............ | H01L 29/66742 |
| | | | | 257/43 |

\* cited by examiner

OXIDE SEMICONDUCTOR-BASED TRANSISTOR AND METHOD OF MANUFACTURING THE SAME

CROSS REFERENCES TO RELATED APPLICATIONS

The present invention contains subject matter related to Korean Patent Application No. 2016-0045069, filed in the Korean Patent Office on Apr. 12, 2016, the entire contents of which are incorporated herein by reference.

FIELD

The present invention relates to an oxide semiconductor-based transistor and a method of manufacturing the same, and more particularly, to an oxide semiconductor-based transistor and a method of manufacturing the same using a solution process employed in manufacturing of electronic devices such as a display backplane device, a flexible device, and a transparent device.

BACKGROUND

A flat panel display such as a liquid crystal display is provided with an active device such as a thin-film transistor in each pixel to drive a display element. A method of driving such a type of display element is generally called an active matrix type driving. In the active matrix type driving, a thin-film transistor is embedded in each pixel to drive the corresponding pixel.

Meanwhile, a general thin-film transistor is formed by using amorphous silicon in a semiconductor layer. However, since amorphous silicon has a low electron moving velocity, it is difficult to implement high resolution and fast driving capability on an extra-large display screen. For this reason, an oxide thin-film transistor having electron moving velocity ten times faster than that of amorphous silicon has been developed. Recently, the oxide thin-film transistor is highlighted as a device capable of exhibiting ultra-high definition (UD) or higher resolution and a fast driving speed of 240 Hz or higher.

Typically, liquid crystal display devices are fabricated through photolithography. In the photolithography, a series of procedures including deposition of a patterning target material and a photoresist material, exposure using a mask, development of the photoresist, and etching are sequentially processed.

Recently, studies have been widely made for oxide semiconductors applicable in place of silicon-based semiconductor devices for the large-area display. In terms of material, some studies have resulted in feasible single-component, binary, or ternary compounds based on indium oxide ($In_2O_3$), zinc oxide (ZnO), and gallium oxide ($Ga_2O_3$). Meanwhile, in terms of process, studies have been made for a solution-based technique in place of existing vacuum deposition.

Although oxide semiconductors are also amorphous, they have very high mobility relative to hydrogenated amorphous silicon. Therefore, oxide semiconductors are suitable for high-quality liquid crystal devices (LCDs) and active matrix organic light emitting diodes (AMOLEDs). In addition, a technology of manufacturing an oxide semiconductor using a solution-based process is cost-effective while vacuum deposition techniques are expensive.

However, disadvantageously, oxide transistors fabricated using indium-zinc oxide (IZO) in the prior art are unstable from electrical and environmental viewpoints.

CITATION LIST

[Patent Literature 1] Korean Patent Application Laid-open Publication No. 10-2008-0082616

SUMMARY

In view of the problems described above, the present invention provides a transistor having a hybrid active channel formed of [2-(4-T-BUTYLPHENYL)-5-(4-BIPHENYLYL)-1,3] (hereinafter, referred to as "PBD") and indium-zinc oxide (IZO) as a material of an electron transport layer (ETL) and a method of manufacturing the same in order to improve mobility of electric charges and stability of electric devices and provide a controllable threshold voltage. In addition, the present invention provides indium-zinc oxide formed through a solution process technology. In addition, the present invention provides an indium-zinc oxide semiconductor transistor having a wide band gap applicable in a transparent electronic device. In addition, the present invention provides an oxide semiconductor transistor obtainable under a relatively low temperature and applicable in a flexible electronic device.

It should be noted that the object of the present invention is not limited to those described above, and other features and objects would become more apparent to those skilled in the art by reading the following description although they are not specifically described.

According to an aspect of the present invention, there is provided an oxide semiconductor-based transistor including: a substrate provided with a bottom electrode; an insulator layer formed on the substrate; an active layer formed on the insulator layer; an electron transport layer formed on the active layer; and a top electrode formed on the electron transport layer.

In the oxide semiconductor-based transistor described above, the substrate may be an n-type silicon substrate.

In the oxide semiconductor-based transistor described above, the insulator layer may be formed by growing silicon oxide ($SiO_2$) from the silicon substrate through thermal oxidization.

In the oxide semiconductor-based transistor described above, the active layer may be formed of indium-zinc oxide (IZO).

In the oxide semiconductor-based transistor described above, the electron transport layer may be formed of [2-(4-T-BUTYLPHENYL)-5-(4-BIPHENYLYL)-1,3] (hereinafter, referred to as a "PBD").

In the oxide semiconductor-based transistor described above, the top electrode may be formed of aluminum (Al).

In the oxide semiconductor-based transistor described above, the active layer may be formed by manufacturing an IZO thin film based on a solution process using a reagent containing [$In(NO_3)_3.H_2O$] and [$Zn(CH_3COO)_2.2H_2O$].

In the oxide semiconductor-based transistor described above, the electron transport layer is formed by depositing the PBD on the IZO thin film.

In the oxide semiconductor-based transistor described above, the top electrode may be formed by depositing aluminum pellets in vacuum using a metal evaporator.

In the oxide semiconductor-based transistor described above, the bottom electrode may be used as a gate electrode, and the top electrode may be divided into a pair of pieces used as a source electrode and a drain electrode.

According to another aspect of the present invention, there is provided a method of manufacturing an oxide semiconductor-based transistor, including: fabricating a substrate provided with a bottom electrode; forming an insulator layer on the substrate; forming an active layer on the insulator layer; forming an electron transport layer on the active layer; and forming a top electrode on the electron transport layer.

In the method described above, the substrate may be an n-type silicon substrate in the fabrication of the substrate.

In the method described above, the insulator layer may be formed by growing silicon oxide ($SiO_2$) from the silicon substrate through thermal oxidation in the formation of the insulator layer.

In the method described above, the active layer may be formed of indium-zinc oxide (IZO) in the formation of the active layer.

In the method described above, the electron transport layer may be formed of [2-(4-T-BUTYLPHENYL)-5-(4-BIPHENYLYL)-1,3] (hereinafter, referred to as a "PBD") in the formation of the electron transport layer.

In the method described above, the top electrode may be formed of aluminum (Al) in the formation of the top electrode.

In the method described above, the active layer may be formed by manufacturing an IZO thin film based on a solution process using a reagent containing $[In(NO_3)_3 \cdot xH_2O]$ and $[Zn(CH_3COO)_2 \cdot 2H_2O]$ in the formation of the active layer.

In the method described above, the electron transport layer is formed by depositing the PBD on the IZO thin film in the formation of the electron transport layer.

In the method described above, the top electrode is formed by depositing aluminum pellets in vacuum using a metal evaporator in the formation of the top electrode.

In the method described above, the bottom gate may be used as a gate electrode, and the top electrode may be divided into a pair of pieces used as a source electrode and a drain electrode.

According to the present invention, since the oxide semiconductor-based transistor has a hybrid channel of PBD formed along with indium-zinc oxide (IZO), it is possible to improve mobility of electric charges and stability of electric devices and control a threshold value.

According to the present invention, since the threshold voltage is controlled based on the thickness of the PBD, it is possible to reduce power consumption in a digital circuit and improve efficiency.

According to the present invention, it is possible to fabricate an indium-zinc oxide semiconductor transistor having a large band gap and employ it in a transparent electronic device.

According to the present invention, it is possible to fabricate the oxide semiconductor transistor under a lower temperature environment and employ it in a flexible electronic device.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1:
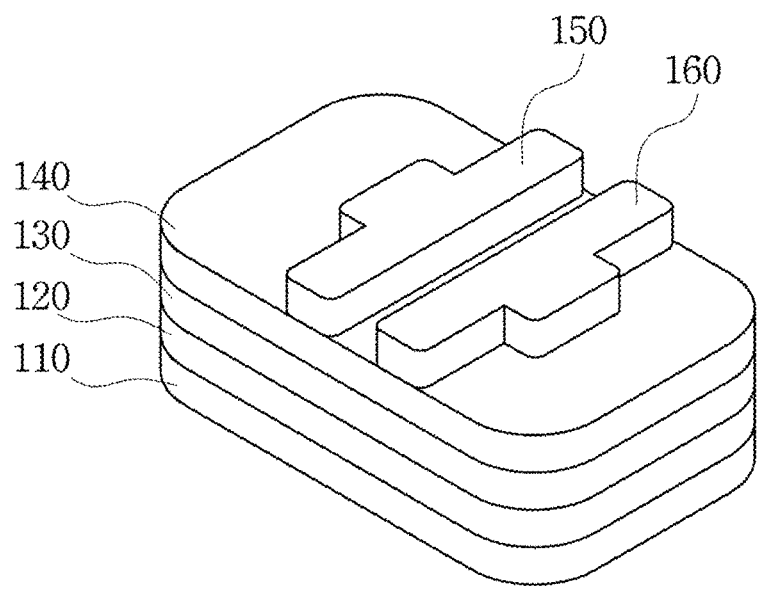
FIG. 1 illustrates a layer structure of an oxide semiconductor-based transistor according to an embodiment of the invention.

Hereinafter, embodiments of the invention will be described in detail with reference to the accompanying drawings. It is noted that like reference numerals denote like elements throughout overall drawings. In addition, descriptions of well-known apparatus and methods may be omitted so as to not obscure the description of the representative embodiments, and such methods and apparatus are clearly within the scope and spirit of the present disclosure.

The terminology used herein is only for the purpose of describing particular embodiments and is not intended to limit the invention. As used herein, the singular forms "a," "an," and "the" may be intended to include the plural forms as well, unless the context clearly indicates otherwise. It is further to be noted that, as used herein, the terms "comprises", "comprising", "include", and "including" indicate the presence of stated features, integers, steps, operations, units, and/or components, but do not preclude the presence or addition of one or more other features, integers, steps, operations, units, and/or components, and/or combination thereof.

Unless specified otherwise, all terminologies used herein including technical or scientific terminologies have the same meanings as those generally appreciated by a person ordinarily skill in the art to which the present invention pertains. Terminologies defined in typical dictionaries should be construed to have meanings matching those described in the context of the related art, and should not be construed as being abnormal or excessively formal unless defined apparently herein.

The present invention will now be described with reference to the accompanying drawings, in which like reference numerals denote like elements throughout the entire specification, and they will not be repeatedly described intentionally. In the following description, any specific word or sentence for the related art will not be provided for simplicity purposes if it unnecessarily obscures the subject matter of the invention.

FIG. 1 illustrates a layer structure of an oxide semiconductor-based transistor according to an embodiment of the invention.

Referring to FIG. 1, the oxide semiconductor-based transistor according to an embodiment of the invention includes a substrate 110, an insulator layer 120, an active layer 130, an electron transport layer 140, and top electrodes 150 and 160.

The substrate 110 is fabricated to include a bottom layer. According to an embodiment of the invention, the substrate 110 may be a heavily doped n-type ($n^{++}$) silicon substrate.

The insulator layer 120 is formed on the substrate 110. According to an embodiment of the invention, the insulator layer 120 may be formed by growing silicon oxide ($SiO_2$) from the silicon substrate through thermal oxidation.

The active layer 130 is formed on the insulator layer 120. According to an embodiment of the invention, the active layer 130 may be formed of indium-zinc oxide (IZO).

According to an embodiment of the invention, the active layer 130 may be formed by manufacturing an IZO thin film based on a solution process using a reagent containing $[In(NO_3)_3.xH_2O]$ and $[Zn(CH_3COO)_2.2H_2O]$.

The electron transport layer 140 is formed on the active layer 130.

The electron transport layer 140 according to an embodiment of the invention may be formed by depositing [2-(4-T-BUTYLPHENYL)-5-(4-BIPHENYLYL)-1,3] (PBD) on the IZO thin film.

Figure 3:
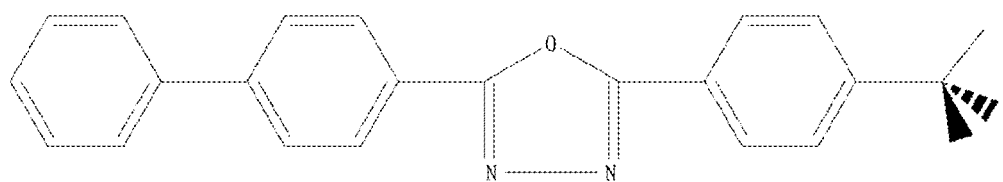
FIG. 3 illustrates a chemical expression of PBD according to an embodiment of the invention.

According to an embodiment of the invention, the electron transport layer 140 may be formed of PBD. FIG. 3 illustrates a chemical expression of the PBD according to an embodiment of the invention.

The top electrodes 150 and 160 are formed on the electron transport layer 140. According to an embodiment of the invention, the top electrodes 150 and 160 may be formed of aluminum (Al). In this case, the top electrodes 150 and 160 may be formed by depositing aluminum pellets in vacuum using a metal evaporator.

According to the present invention, the bottom electrode may be used as a gate electrode, and a pair of top electrodes may be used as source and drain electrodes 150 and 160.

Figure 2:
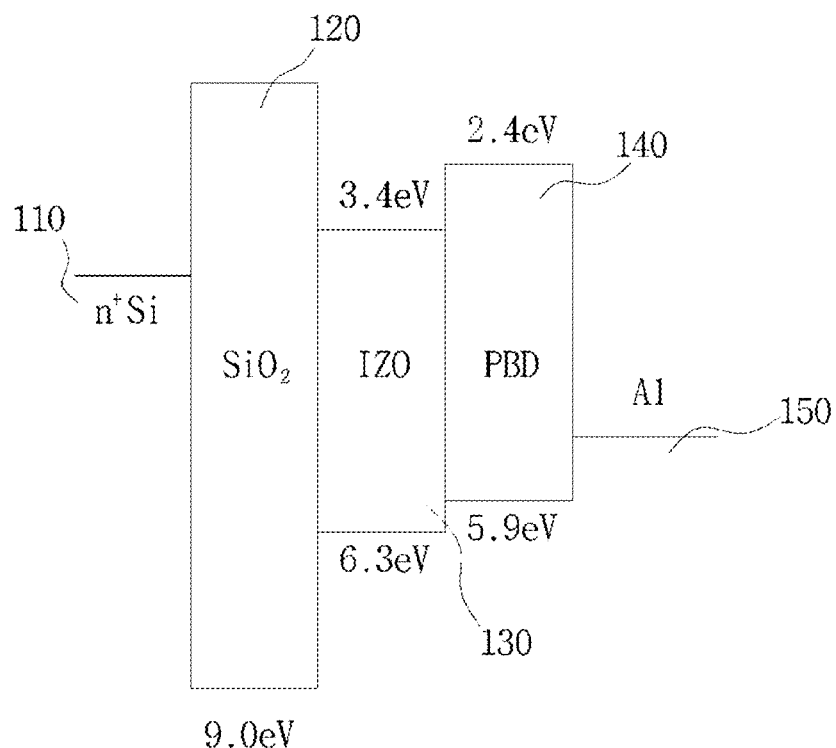
FIG. 2 illustrates energy band levels of elements of the oxide semiconductor-based transistor according to an embodiment of the invention.

FIG. 2 illustrates energy band levels of elements in the oxide semiconductor-based transistor according to an embodiment of the invention.

Referring to the energy band levels of FIG. 2, it is recognized that electrons moving from aluminum can be more easily moved to the IZO thin film due to the PBD.

Figure 6:
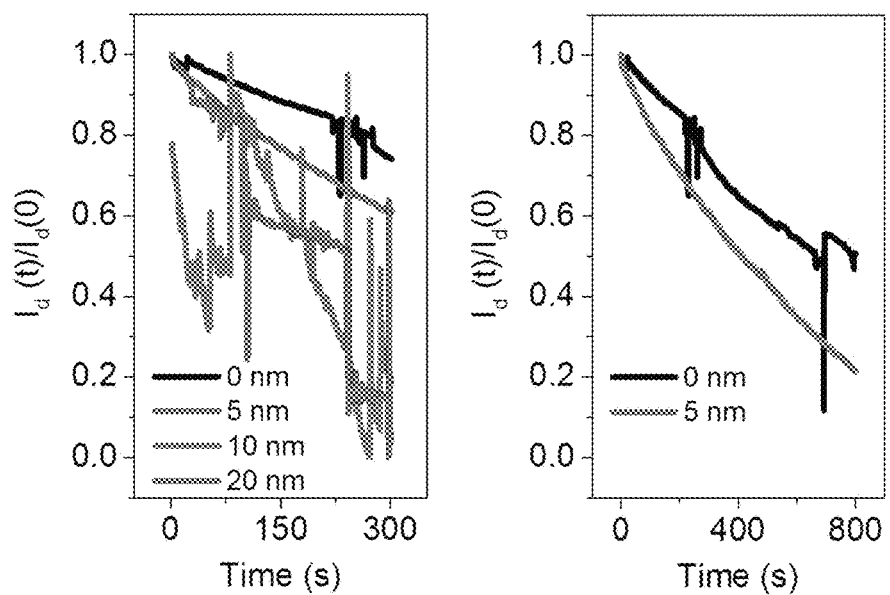
FIG. 6 illustrates a result of a stress test depending on a thickness of the PBD in an indium-zinc oxide transistor according to an embodiment of the invention.

However, as illustrated in FIG. 6, it is recognized that a positive shift of the threshold voltage Vth is generated, and electric stability is degraded if the PBD having a thickness of 10 nm or larger is deposited.

Figure 4:
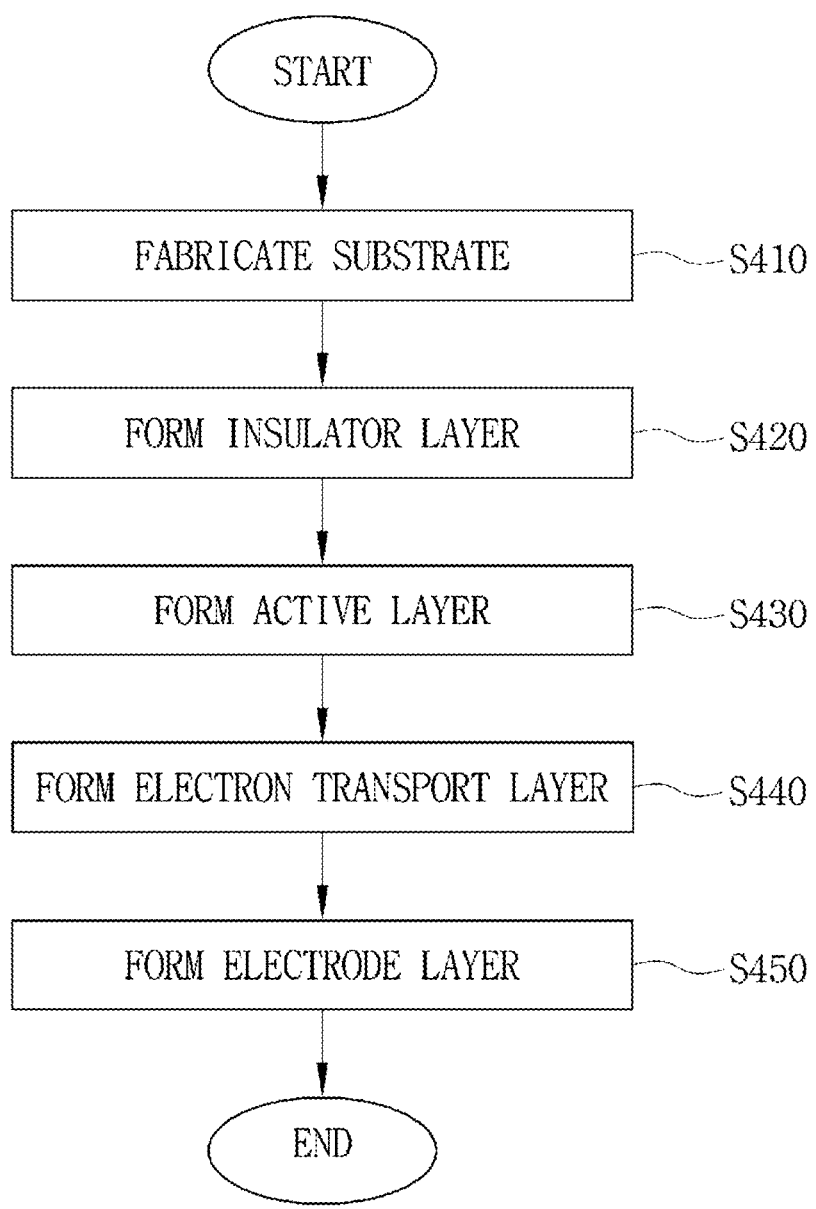
FIG. 4 is a flowchart illustrating a method of manufacturing an oxide semiconductor-based transistor according to an embodiment of the invention.

FIG. 4 is a flowchart illustrating a method of manufacturing an oxide semiconductor-based transistor according to an embodiment of the invention.

Referring to FIG. 4, in the method of manufacturing an oxide semiconductor-based transistor according to an embodiment of the invention, first, a substrate provided with a bottom electrode may be formed of an n-type silicon substrate.

Then, an insulator layer 120 is formed on the substrate 110 (S420). In the process (S420) of forming the insulator layer, the insulator layer 120 may be formed by growing silicon oxide ($SiO_2$) on the silicon substrate through thermal oxidization.

Then, an active layer 130 is formed on the insulator layer 120.

Then, an electron transport layer 140 is formed on the active layer 130 (S440). In the process (S430) of forming the active layer, the active layer may be formed of indium-zinc oxide (IZO).

Then, top electrodes 150 and 160 are formed on the electron transport layer 140 (S450). In the process (S440) of forming the electron transport layer, the electron transport layer may be formed of PBD.

In the process (S450) of forming the top electrodes, the top electrodes may be formed of aluminum (Al).

According to an embodiment of the invention, in the process (S430) of forming the active layer 130, the active layer 130 may be formed by manufacturing an IZO thin film based on a solution process using a reagent containing $[In(NO_3)_3.xH_2O]$ and $[Zn(CH_3COO)_2.2H_2O]$.

In the process (S440) of forming the electron transport layer 140 according to an embodiment of the invention, the electron transport layer 140 may be formed by depositing PBD on the IZO thin film.

In the process (S450) of forming the top electrode 150 according to an embodiment of the invention, the top electrodes 150 and 160 may be formed by depositing aluminum pellets in vacuum using a metal evaporator.

An exemplary process of manufacturing an oxide transistor according to the present invention will now be described.

First, a substrate provided with a bottom electrode is formed from a heavily doped n-type silicon substrate at a thickness of 600 µm.

Silicon oxide ($SiO_2$) having a thickness of 100 nm is grown through thermal oxidization to form an insulator layer.

In order to fabricate an IZO oxide thin film based on a solution process, indium nitrate hydrate $[In(NO_3)_3.xH_2O]$ and zinc acetate dihydrate $[Zn(CH_3COO)_2.2H_2O]$ are employed as a reagent.

As a solvent for producing indium and zinc solutions of 0.1 M (molar concentration), 2-methoxyethanol is employed. Acetylacetone serving as a stabilizer for dissolving the reagent is added to the indium solution. For expediting reaction, ammonia (NH3) as a catalyst is added. In addition, only acetylacetone as a stabilizer is added to the zinc solution. Then, the indium solution and the zinc solution are stirred for an hour under a temperature of 60° C.

Then, the indium (In) solution and the zinc (Zn) solution are mixed at a mixing ratio of 7:3, and stirring is performed for two hours under a temperature of 27° C.

In order to form an IZO channel, spin coating is performed at a rotation speed of 1,500 rpm, and then annealing is performed. As a result, an IZO thin film having a thickness of 20 to 30 nm is formed.

The PBD used as a material of the electron transport layer is deposited on the IZO thin film at a thickness of 0 to 20 nm. According to an embodiment of the invention, a PBD powder is deposited on the IZO thin film using an organic evaporator at thicknesses of 0, 5, 10, and 20 nm.

Finally, for forming source and drain electrodes, aluminum pellets are deposited at a thickness of 100 nm in vacuum using a metal evaporator.

Electric characteristics of the resulting oxide semiconductor device are measured under a room environment using a semiconductor device analyzer AGILENT® B1500. The measurement results are shown in FIG. 5.

EXPERIMENTAL EXAMPLES

Figure 5:
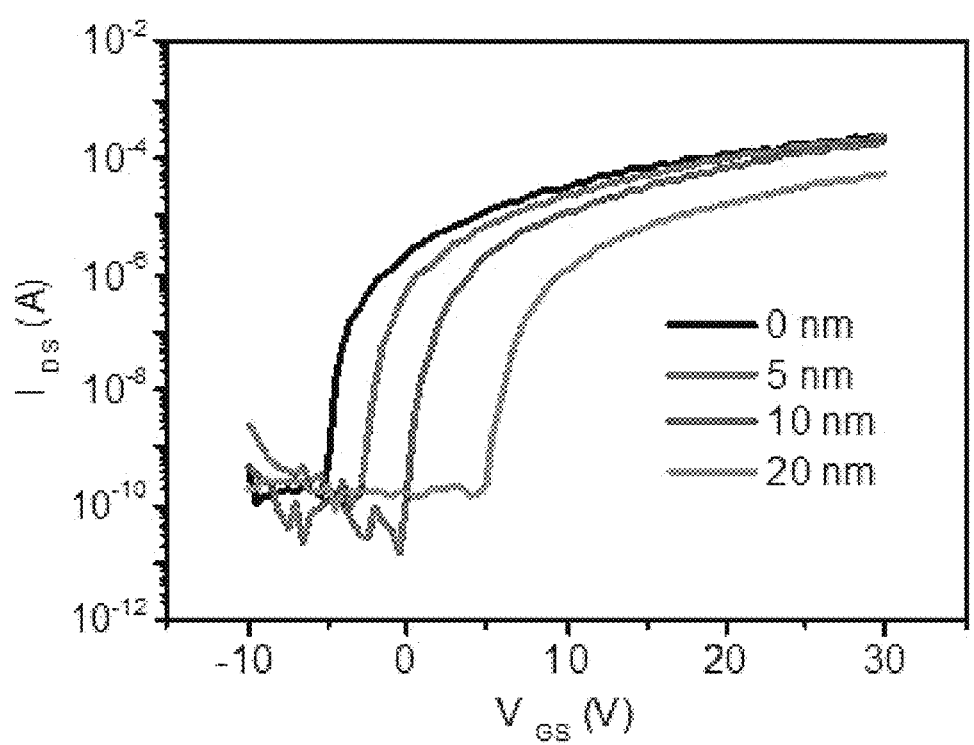
FIG. 5 illustrates transfer characteristics depending on a thickness of the PBD in an indium-zinc oxide thin-film transistor according to an embodiment of the invention.

FIG. 5 illustrates transfer characteristics depending on a thickness of the PBD in an indium-zinc oxide thin-film transistor according to an embodiment of the invention.

Referring to FIG. 5, transfer characteristics of the transistor device are plotted when the PBD thin film has thicknesses of "0, 5, 10, and 20 nm." In the measurement of the transistor device, a drain is grounded, and voltages are applied to a source and a gate. A drain current is measured by applying a voltage of −10 to 30 V to the gate. As a result, it is recognized that excellent transistor characteristics are obtained when the PBD has a thickness of 5 nm. In addition, power consumption and efficiency in a digital circuit can be improved by controlling the threshold voltage depending on a variation of the thickness.

FIG. 6 illustrates a result of an electrical stress test as a function of the time depending on a thickness of the PBD in an indium-zinc oxide transistor according to an embodiment of the invention.

Referring to FIG. 6, it is recognized that performance of the transistor is unsatisfactory when the PBD has a thickness equal to or larger than "10 nm." In addition, electrical stability is highest when the PBD has a thickness of "5 nm." Furthermore, the drain current becomes unstable as time elapses when the PBD has a thickness equal to or larger than "5 nm."

Figure 7:
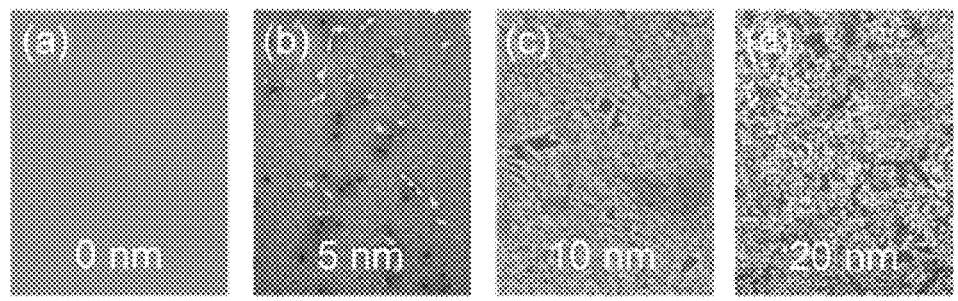
FIG. 7 shows scanning optical microscopic images obtained by capturing a surface of an oxide transistor depending on a deposition thickness of the PBD according to an embodiment of the invention.

FIG. 7 shows optical microscopic images obtained by capturing a surface of an oxide transistor depending on a deposition thickness of the PBD according to an embodiment of the invention.

Referring to FIG. 7, the optical images (a), (b), (c), and (d) show surfaces of the oxide transistors having PBD deposition thicknesses of 0, 5, 10, and 20 nm, respectively.

The IZO thin-film transistor (TFT) using an oxide semiconductor material is fabricated as a high-quality PLED display driving backplane device. According to the present invention, since the electron transport layer (ETL) capable of improving electron mobility forms a hybrid channel along with the oxide semiconductor layer, it is possible to improve important device parameters such as electric charge mobility or an ON/OFF ratio and implement a faster and more accurate device. Finally, the present invention is expected to be used as a core technology for improving performance of a next-generation display.

Although exemplary embodiments of the present invention have been shown and described, it will be apparent to those having ordinary skill in the art that a number of changes, modifications, or alterations to the invention as described herein may be made, none of which depart from the spirit of the present invention. All such changes, modifications and alterations should therefore be seen as within the scope of the present invention.

What is claimed is:

1. An oxide semiconductor-based transistor comprising:
a substrate;
a bottom electrode disposed directly on the substrate;
an insulator layer formed on the substrate;
an active layer formed on the insulator layer, the active layer including an indium-zinc oxide (IZO) thin film formed using a 2-methoxyethanol solvent, acetylacetone as a stabilizer, and ammonia ($NH_3$) as a catalyst, at an indium to zinc mixing ratio of 7:3;
an electron transport layer formed on the active layer, the electron transport layer formed of a [2-(4-T-BUTYL-PHENYL)-5-(4-BIPHENYLYL)-1,3] (PBD) powder deposited on the IZO thin film, the PBD having a thickness of less than 10 nm; and
a top electrode formed on the electron transport layer, the top electrode comprising at least one of a source electrode including one or more aluminum pellets and a drain electrode including one or more aluminum pellets.

2. The oxide semiconductor-based transistor according to claim 1, wherein the substrate is an n-type silicon substrate.

3. The oxide semiconductor-based transistor according to claim 2, wherein the insulator layer is formed by growing silicon oxide ($SiO_2$) from the silicon substrate through thermal oxidization.

4. The oxide semiconductor-based transistor according to claim 3, wherein the active layer is formed by manufacturing an IZO thin film based on a solution process using a reagent containing $[In(NO_3)_3 \cdot xH_2O]$ and $[Zn(CH_3COO)_2 \cdot 2H_2O]$.

5. The oxide semiconductor-based transistor according to claim 4, wherein the top electrode is formed by depositing the one or more aluminum pellets in a vacuum using a metal evaporator.

6. The oxide semiconductor-based transistor according to claim 1, wherein the bottom electrode is used as a gate electrode, and the top electrode is divided into a pair of pieces used as a source electrode and a drain electrode.

7. The oxide semiconductor-based transistor according to claim 1, wherein the IZO thin film has a thickness between 20 and 30 nm.

8. A method of manufacturing an oxide semiconductor-based transistor, comprising:
fabricating a substrate provided with a bottom electrode, the bottom electrode disposed directly on the substrate;
forming an insulator layer on the substrate;
forming an active layer on the insulator layer, the active layer including an indium-zinc oxide (IZO) thin film, the IZO film formed using a 2-methoxyethanol solvent, acetylacetone as a stabilizer, and ammonia ($NH_3$) as a catalyst, and mixing an indium solution and a zinc solution at a mixing ratio of 7:3;
forming an electron transport layer on the active layer, the electron transport layer formed of a [2-(4-T-BUTYL-PHENYL)-5-(4-BIPHENYLYL)-1,3] (PBD) powder deposited on the IZO thin film, the PBD having a thickness of less than 10 nm; and
forming a top electrode on the electron transport layer, the top electrode comprising at least one of a source electrode including one or more aluminum pellets and a drain electrode including one or more aluminum pellets.

9. The method according to claim 8, wherein, in the fabrication of the substrate, the substrate is an n-type silicon substrate.

10. The method according to claim 9, wherein, in the formation of the insulator layer, the insulator layer is formed by growing silicon oxide ($SiO_2$) from the silicon substrate through thermal oxidation.

11. The method according to claim 10, wherein, in the formation of the active layer, the active layer is formed by manufacturing an IZO thin film based on a solution process using a reagent containing $[In(NO_3)_3 \cdot xH_2O]$ and $[Zn(CH_3COO)_2 \cdot 2H_2O]$.

12. The method according to claim 11, wherein, in the formation of the top electrode, the top electrode is formed by depositing the one or more aluminum pellets in a vacuum using a metal evaporator.

13. The method according to claim 8, wherein the bottom gate is used as a gate electrode, and
the top electrode is divided into a pair of pieces used as a source electrode and a drain electrode.

14. The oxide semiconductor-based transistor according to claim 8, wherein the IZO thin film has a thickness between 20 and 30 nm.

* * * * *